United States Patent [19]

Okase

[11] Patent Number: 5,592,581
[45] Date of Patent: Jan. 7, 1997

[54] HEAT TREATMENT APPARATUS

[75] Inventor: Wataru Okase, Sagamihara, Japan

[73] Assignees: Tokyo Electron Kabushiki Kaisha, Tokyo-To; Tokyo Electron Tohoku Kabushiki, Iwate-Ken, both of Japan

[21] Appl. No.: 276,848

[22] Filed: Jul. 18, 1994

[30] Foreign Application Priority Data

| Jul. 19, 1993 | [JP] | Japan | 5-198807 |
| Dec. 28, 1993 | [JP] | Japan | 5-351399 |

[51] Int. Cl.$^6$ .................. H01L 21/02; F27D 11/02
[52] U.S. Cl. .................. 392/418; 392/416; 219/405; 219/410; 118/50.1
[58] Field of Search .................. 392/416, 418; 219/390, 405, 410; 118/50.1, 725, 729, 733; 432/152

[56] References Cited

U.S. PATENT DOCUMENTS

| 4,533,820 | 8/1985 | Shimizu | 219/411 |
| 5,095,192 | 3/1992 | McEntire et al. | 219/402 |
| 5,108,792 | 4/1992 | Anderson et al. | 118/725 |
| 5,179,677 | 1/1993 | Anderson et al. | 392/411 |
| 5,187,771 | 2/1993 | Uchiza | 392/416 |
| 5,252,132 | 10/1993 | Oda et al. | 118/725 |
| 5,314,541 | 5/1994 | Saito et al. | 118/725 |
| 5,418,885 | 5/1995 | Hauser et al. | 392/416 |

FOREIGN PATENT DOCUMENTS

| 0468874A2 | 1/1992 | European Pat. Off. | 392/416 |
| 59-158952 | 9/1984 | Japan | 392/416 |
| 63-41028 | 2/1988 | Japan | 118/725 |
| 1-248626 | 10/1989 | Japan | 392/418 |
| 2-34164 | 8/1990 | Japan . | |

*Primary Examiner*—Teresa J. Walberg
*Assistant Examiner*—J. Pelham
*Attorney, Agent, or Firm*—Beveridge, DeGrandi, Weilacher & Young, LLP

[57] ABSTRACT

The workpiece, which is horizontally held in the treatment chamber, is heated by the planar heat generating members disposed on the upper and lower surfaces of the treatment chamber and controlled to predetermined temperature through respective heat equalizing members. Thus, the workpiece can be quickly heated with an equal temperature distribution and high repeatability on the entire surface regardless of the diameter thereof. Further, a stream that is vertically symmetrical is obtained due to the shapes of the shoulder portions. Thus, since an eddy current and a turbulence that tend to take place upon supply of a process gas is prevented, the process gas can be equally contacted to the entire surface of the workpiece.

22 Claims, 8 Drawing Sheets

FIG. I

HEAT TREATMENT APPARATUS

BACKGROUND OF THE INVENTION

1. Field of the invention

The present invention relates to a heat treatment apparatus for heat-treating a workpiece disposed in a process tube.

2. Description of the Related Art

Various heat treatment apparatuses that perform oxidizing treatment, diffusing treatment, CVD treatment, and the like have been employed for fabricating semiconductor wafers. In conventional heat treatment apparatuses, a process tube is disposed in an upright type treatment furnace. A heater is disposed around the process tube. Wafers, which are workpieces, are placed in a wafer boat in such a manner that they are horizontally aligned therein. The wafer boat is placed in the process tube and heat treated in a process gas atmosphere at a high temperature.

In the heat treatment apparatuses, the temperature distribution of each wafer finally becomes equal. However, when the wafer boat is placed in the process tube, since the wafer boat is surrounded by the heater, the temperature at the peripheral portion of each water is higher than the temperature at the center portion thereof. Therefore, as the diameter of wafers becomes large, the temperature difference between the peripheral portion and the center portion becomes large (for example, ±50° C.). Thus, skewing, crystal defect, or the like take place in the wafers.

In addition to the equal temperature distribution, to keep the film forming condition on the surface of each workpiece equal, the contacting conditions of the workpiece and the process gas should be improved.

When a process gas is supplied to a workpiece, if the process gas flows along the surface of the workpiece, if the gas contacting condition on the upstream side of the process gas may differ from the gas contacting condition on the other sides. In other words, the concentration of the process gas that contacts the peripheral portion of the workpiece on the upstream side of the process gas is relatively higher than the concentration of the process gas that contacts the center portion of the workpiece on the downstream side of the process gas. When the process gas contacts the center portion of the workpiece, the stream of the process gas is agitated and thereby an eddy current or a turbulence may take place. Thus, the concentrations of the process gas differs between the center portion of the workpiece and the peripheral portion thereof. As a result, since the concentration of the process gas that contacts the center portion is low, the thickness of the film formed at the center portion differs from the thickness of the film formed at the peripheral portion. The occurrences of the eddy current and turbulence of the process gas relate to critical Reynolds number $R = Ud/\upsilon$ (where U is the flow velocity, d is the diameter of the flow path, and n is the coefficient of kinematic viscosity).

SUMMARY OF THE INVENTION

An object of the present invention is to provide a heat treatment apparatus for heat treating a workpiece with an equal temperature distribution regardless of the diameter thereof.

Another object of the present invention is to provide a heat treatment apparatus for causing the temperature distribution and the concentration of a process gas to be equal on the entire surface of a workpiece so as to equally form a film thereon.

According to the one aspect of the present invention, a heat treatment apparatus comprising:

a treatment chamber for heat-treating a workpiece arranged therein;

means for transferring the workpiece into said treatment chamber, and transferring the heat-treated workpiece from said treatment chamber to the outside thereof;

means for holding the workpiece transferred into said chamber; and a planar heat generating source arranged above and below the workpiece and having a heat equalizing member provided between the workpiece and the planar heat generating source, so as to heat the workpiece held in said chamber to the predetermined temperature.

The workpiece, which is horizontally held in the treatment chamber, is heated by the planar heat generating members disposed on the upper and lower surfaces of the treatment chamber and controlled to predetermined temperatures through respective heat equalizing members. Thus, the workpiece can be quickly heated with an equal temperature distribution and high repeatability on the entire surface regardless of the diameter thereof. In addition, with a temperature difference between the upper and lower planar heating members, a temperature slope is formed in the vertical direction of the treatment chamber. Moreover, the position of the workpiece against the planar heating members can be adjusted by the holding portion. Thus, the heat treatment can be performed at a proper temperature corresponding to the treatment.

According to another aspect of the present invention, a heat treatment apparatus comprising:

a treatment chamber for heat-treating a workpiece arranged therein;

means for transferring the workpiece into said treatment chamber, and transferring the heat-treated workpiece from said treatment chamber to the outside thereof;

means for holding the workpiece transferred into said chamber;

a planar heat generating source arranged above and below the workpiece and having a heat equalizing member provided between the workpiece and the planar heat generating source, so as to heat the workpiece held in said chamber to the predetermined temperature; and a wall structure having an upper wall portion, a side wall portion, and a lower wall portion which cooperate to constitute said chamber, so that a portion transformed from the upper wall portion to the side wall portion, or a portion transformed from the lower wall portion to the side wall portion is formed to be curved or be inclined thereto.

A stream that is vertically symmetrical is obtained due to the shapes of the shoulder portions. Thus, since an eddy current and a turbulence that tend to take place upon supply of a process gas is prevented, the process gas can be equally contacted to the entire surface of the workpiece. In addition, since the planar heat generating sources are disposed along the shapes of the shoulder portions, the amount of heat radiated to the peripheral portion of the workpiece is larger than the amount of heat radiated to the center portion of the workpiece. Thus, the temperature distribution of the workpiece becomes equal, thereby improving the surface equality of the workpiece. Moreover, the planar heat generating members are supported by the heat insulating piece members disposed corresponding to the shapes of the shoulder portions of the treatment chamber. In addition, since the heat insulating piece members are divided into a plurality of zones corresponding to the shoulder portions, the amount of heat radiated to the workpiece can be varied corresponding to the shapes of the shoulder portions. Thus, the temperature distribution on the surface of the workpiece becomes equal.

These and other objects, features and advantages of the present invention will become more apparent in light of the following detailed description of best mode embodiments thereof, as illustrated in the accompanying drawings.

DESCRIPTION OF PREFERRED EMBODIMENTS

With reference to FIGS. 1 to 5, a heat treatment apparatus according to a first embodiment of the present invention will be described.

Figure 1:
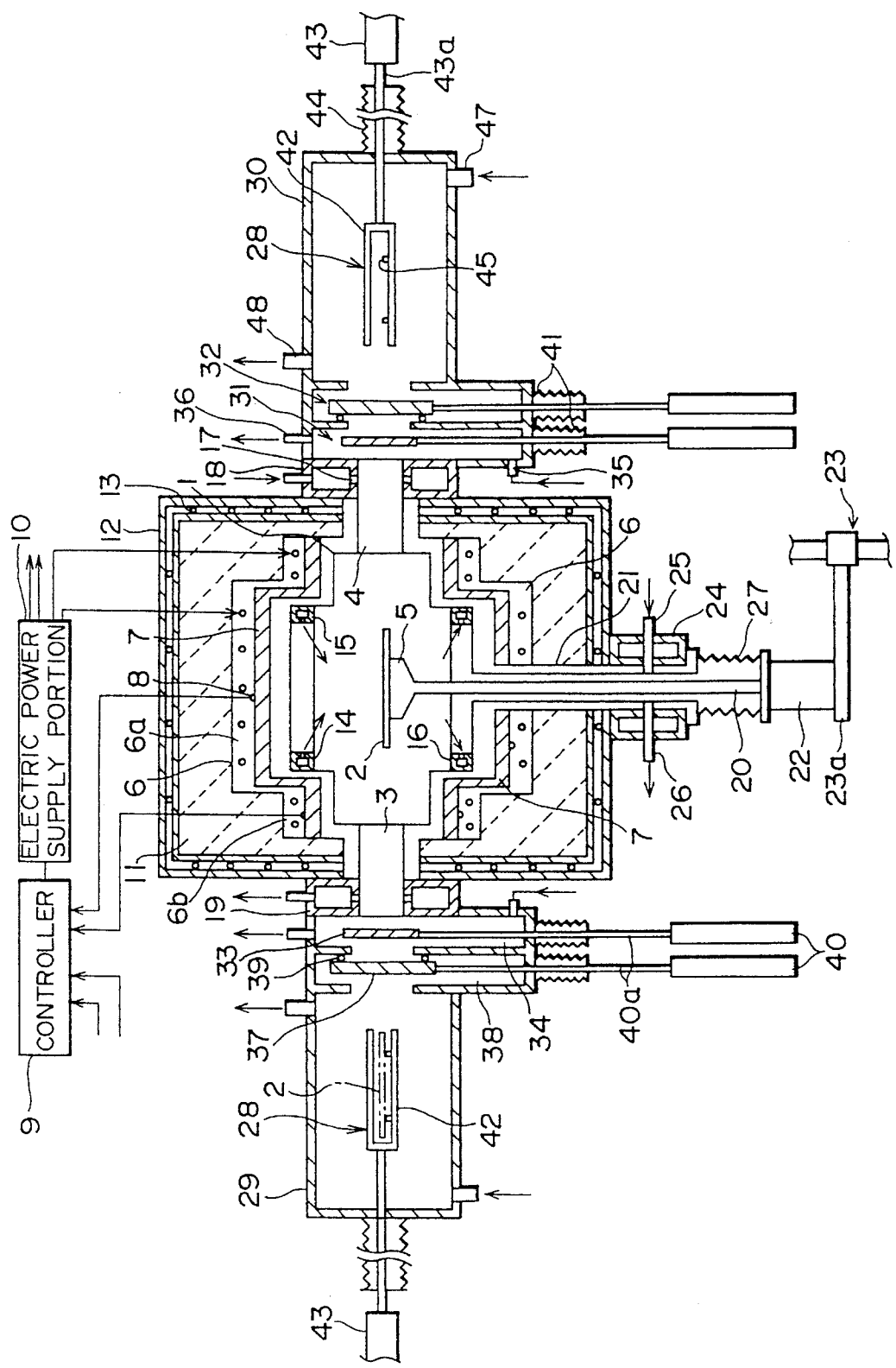
FIG. 1 is a side sectional view showing a heat treatment apparatus according to a first embodiment of the present invention.
Figure 2:
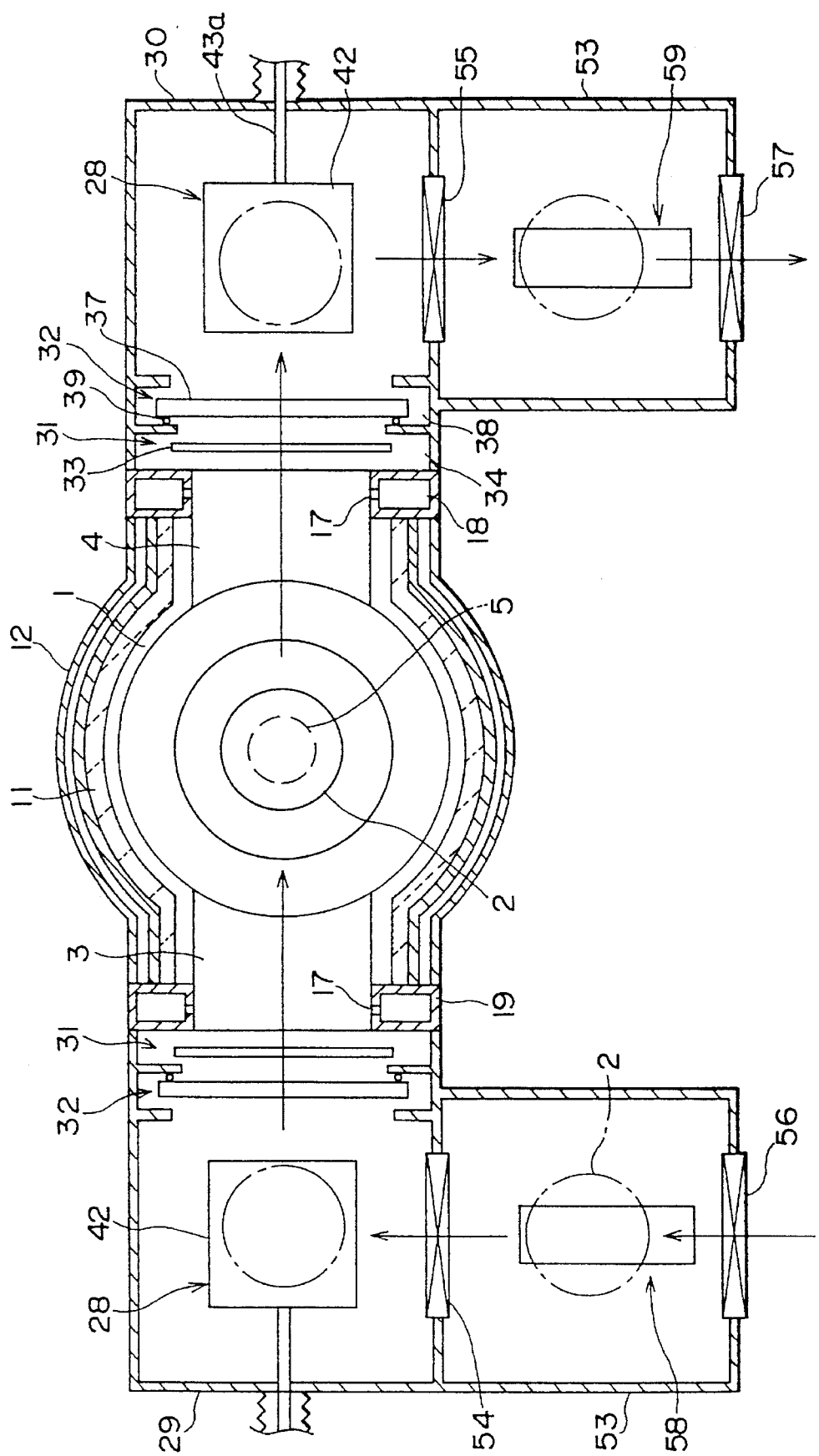
FIG. 2 is a sectional plan view showing the heat treatment apparatus of FIG. 1.

As shown in FIGS. 1 and 2, a treatment chamber 1 is disposed. The treatment chamber 1 constructs a treatment furnace of a heat treatment apparatus (for example, a CVD). The treatment chamber 1 is made of quartz, which has heat resistance and corrosion resistance. Opening portions 3 and 4 are formed on both end portions of the treatment chamber 1. A semiconductor wafer 2, which is a workpiece, is input and output from and to the opening portions 3 and 4, respectively. A holding portion 5 is made of, for example, quartz and disposed at a center portion of the treatment chamber 1. The holding portion horizontally holds the wafer 2, which is input from the opening portion 3. Planar heating members 6 are disposed on an upper portion and a lower portion of the outside of the treatment chamber 1 through respective heat equalizing members 7. Thus, the upper planar heating member 6 and the lower planar heating member 6 are opposed with the wafer 2 therebetween. The planar heating members 6 are formed of resistance heat generating members made of for example molybdenum dicilicide ($MoSI_2$) or KANTHAL (Trade Name) that is disposed in a plane shape. The heat equalizing members 7 are made of for example alumina ($Al_2O_3$) or silicon carbide (SiC), which has heavy metal contaminating resistance and heat equalizing characteristic.

The size of the planar heating member 6 is larger than the size of the wafer 2. Since the size of the planar heating member 6 is limited, there is a temperature difference between the center portion of the wafer 2 and the peripheral portion thereof. To prevent this temperature difference from taking place, a stop portion is formed between a center portion 6a and a peripheral portion 6b of each of the planar heat generating member 6, and the peripheral portion 6b is arranged in parallel with the center portion 6a. In addition, the heat equalizing members 7 and upper and lower portions of the treatment chamber 1 are formed corresponding to the shapes of the planar heating members 6.

In other words, the absorption, reflection, and transmission of the heat wave of which the heat wave is obliquely incident on the wafer 2 are different from those of which the heat wave is normally incident thereon. Therefore, as the present embodiment, in case of that the step portion is formed between the center portion 6a and the peripheral portion 6b of the heat generating member 6, and the peripheral portion 6b is arranged in parallel with the center portion 6a, the heat wave is obliquely incident from the peripheral portion 6b of the heat generating member 6 on the peripheral portion of the wafer 2. Thus, the heat wave is appropriately absorbed and is easily controlled. Consequently, the heat wave at the peripheral portion of the wafer 2 is much more absorbed than at the center, so that temperature difference between the center and peripheral portions is restrained. Thus, the workpiece can be quickly heated with an equal temperature distribution and high repeatability on the entire surface regardless of diameter thereof.

The center portion 6a and the peripheral portion 6b of each of the planar heating members 6 are electrically independent from each other. Each of the center portion 6a and the peripheral portion 6b has a temperature sensor 8. The center portion 6a and the peripheral portion 6b are controlled to respectively predetermined temperatures by a controller 9 through a power supply portion 10. The outside of the treatment chamber 1 is covered with a double-walled casing 12 made of for example stainless steel through a heat insulating space or a heat insulating member 11 such as a quartz wool. The casing 12 contains a cooling pipe 13 that is of water cooling type or the like. The cooling pipe 13 cools the casing 12 so as to prevent the outside of the heat treatment apparatus from being thermally affected.

A first process gas supply portion 15 and an exhaust portion 16 are disposed at an upper portion and a lower portion of the treatment chamber 1. The first process gas supply portion 15 and the exhaust portion 16 are opposed with the treatment chamber 1 therebetween. The first process supply portion 15 serves to form a process gas atmosphere in the treatment chamber 1. The first process gas supply portion 15 and the exhaust portion 16 are formed of a hollow circular cylinder having a plurality of air holes 14. Thus, a gas stream that vertically flows from the first process gas supply portion 15 to the exhaust portion 16 is formed. A second process gas supply portion 18 and an exhaust portion 19 are disposed at the opening portions 4 and 3, respectively. The second process gas supply portion 18 and the exhaust portion 19 are opposed with the treatment chamber 1 therebetween and formed of a hollow square cylinder having a plurality of air holes 17. Thus, a gas stream that horizontally flows is formed from the second process gas supply portion 18 to the exhaust portion 19. The vertical gas stream and the horizontal gas stream can be selected corresponding to the treatment of workpieces.

A vertical shaft 20 made of for example quartz is integrally formed into a lower portion of the holding portion 5.

The vertical shaft 20 is vertically and rotationally moved to a desired position of the treatment chamber 1. A lower end portion of the vertical shaft 20 is connected to an external motor 22 through a pipe portion 21 that vertically pierces the heat equalizing member 7, the planar heating member 6, the heat insulating member 11, and the casing 12. The pipe portion 21 is integrally formed into the treatment chamber 1. The motor 22 is connected to a lifting device 23 through a lifting arm 23a. A cooling pipe 24 is disposed on the outer periphery of the pipe portion 21 that extends from a lower portion of the casing 12. In addition, a protect gas supply pipe 25 and an exhaust pipe 26 are connected to the pipe portion 21. The protect gas supply pipe 25 supplies a protect gas that is an inert gas such as N, that protects a process gas from flowing. A bellows portion 27 is disposed between the lower end portion of the pipe portion 21 and the motor 22 so as to allow the motor 22 to vertically move the vertical shaft and seal the portion therebetween.

An input chamber 29 and an output chamber 30 are disposed in the treatment chamber 1. The input chamber 29 and the output chamber 30 are opposed with the treatment chamber 1 therebetween. The input chamber 29 and the output chamber 30 have respective conveying arms 28 that input and output the wafer 2 to and form the treatment chamber 1 through the opening portions 3 and 4, respectively. Heat shut-out gate valves 31 and gas shut-out gate valves 32 are disposed between the input chamber 29 and the opening portion 3 and between the output chamber and the opening chamber 4. The heat shut-out gate valves 31 shut out heat from the opening portions 3 and 4, whereas the gas shut-out gate valves 32 shut out gas from the opening portions 3 and 4. Each of the heat shut-out gate valves 31 comprises a valve portion 33 and a valve chamber 34. The valve portion 33 is made of alumina or quartz, which has heat resistance and corrosion resistance. The valve chamber 34 accommodates the valve portion 33 so as to open and close the heat shut-out gate valve 31. A gas supply opening 35 and an exhaust opening 36 are disposed in the valve chamber 34. The gas supply opening 35 and the exhaust opening 36 form a gas curtain of an inert gas for shutting out the process gas. Each of the gas shut out gate valves 32 comprises a valve portion 37, a valve chamber 38, and an O ring 39. The valve portion 37 is made of for example anti-corrosively treated aluminum or stainless steel. The valve chamber 38 accommodates the valve portion 37 so as to open and close the gas shut-out gate valve 32. The O ring 39, a sealing member, is disposed at the valve close position of the valve portion 37. Piston rods 40a, 40a of hydraulic cylinders 40, 40 are connected to the valve portions 33 and 37 through bottom portions of the valve chambers 34 and 38, respectively. Bellows portions 41, 41 are disposed between the bottom portions of the valve chambers 34 and 38 and the piston rods 40a, 40a, respectively so as to seal the portions therebetween.

Figure 3:
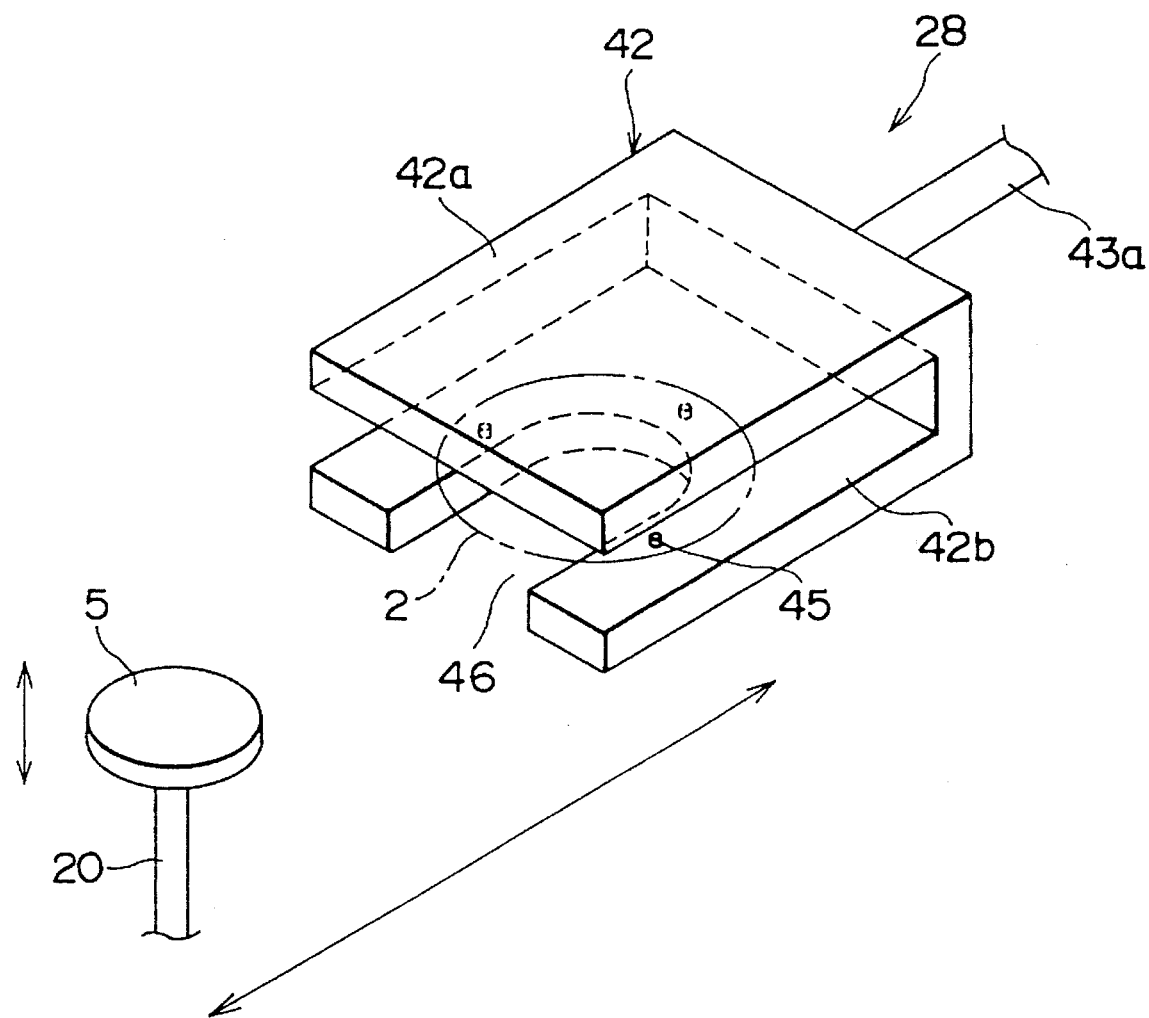
FIG. 3 is a perspective view showing a conveying arm.

Each of the conveying arms 28, which are disposed in the input chamber 29 and the output chamber 30, comprises an arm portion 42 and a hydraulic cylinder 43. The arm portion 42 has an upper plate portion 42a and a lower plate portion 42b that cover the upper surface and the lower surface of the wafer 2, respectively. The arm portion 42 is made of aluminum, stainless steel, or the like. The hydraulic cylinder 43 horizontally moves the arm portion 42. A piston rod 43a of the hydraulic cylinder 43 is connected to the arm portion 42 through a side portion of the input chamber 29 or the output chamber 30. A bellows portion 44 is disposed between a side portion of the input chamber 29 or the output chamber 30 and the piston rod 43a so as to seal the portion therebetween. As shown in FIG. 3, a plurality of (for example, three) bumps that hold the wafer 2 are disposed on the upper surface of the lower plate portion 42b of the arm portion 42. In addition, a blank-out portion 46 is formed on the lower plate portion 42b so as to prevent the conveying arm 28 from interfering with the holding portion 5.

Figure 4:
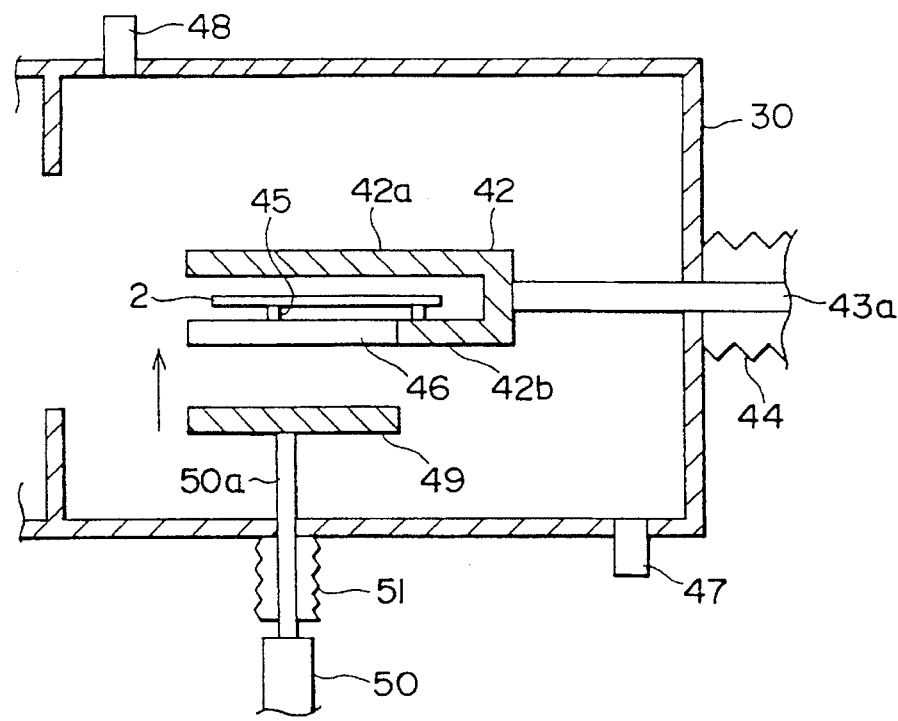
FIG. 4 is an enlarged sectional side view showing an output chamber.

Each of the input chamber 29 and the output chamber 30 is provided with an inert gas supply opening 47 and an exhaust opening 48 so as to keep the inside thereof in an inert gas atmosphere. As a means for equally cooling the entire surface of the wafer 2 that has been just heat-treated, an inert gas is supplied from the inert gas supply opening 47. As shown in FIG. 4, a lid portion 49 that fits to the blank-out portion 46 of the lower plate portion 42b is disposed below the output chamber 30. The lid portion 49 is vertically moved by a hydraulic cylinder 50. A piston rod 50a of the hydraulic cylinder 50 is connected to the lid portion 49 through a bottom portion of the output chamber 30. A bellows portion 51 is disposed between the bottom portion of the output chamber 30 and the piston rod 50a so as to seal the portion therebetween. In this case, so as to improve cooling efficiency on the entire surface of the wafer 2, the arm portion 42 and the lid portion 49 may be water-cooled.

As shown in FIG. 2, load lock chambers 52 and 53 are disposed adjacent to the input chamber 29 and the output chamber 30, respectively, and perpendicular to the moving direction of the conveying arm 28. The load lock chambers 52 and 53 substitute atmospheric air with the inert gas. Gate valves 54 and 55 are disposed between the input chamber 29 and the load lock chamber 52 and between the output chamber 30 and the load lock chamber 53, respectively. Gate valves 56 and 57 are disposed in the load lock chambers 52 and 53, respectively. The gate valves 56 and 57 are connected to the outside of the heat treatment apparatus. Handling devices 58 and 59 are disposed in the load lock chambers 52 and 53, respectively. The handling devices 58 and 59 transfer the wafer 2 between the gate valves 56 and 57 and the outside and between the gate valves 54 and 55 and the arm portion 42 of the conveying arm 28.

Next, the operation of the above-described heat treatment apparatus will be described.

The wafer is transferred to the arm portion 42 of the conveying arm 28 in the input chamber 29 through the load lock chamber 52. The wafer 2 is conveyed by the conveying arm 28 that moves to the inside of the treatment chamber 1 through the gas shut-out gate valve 32 and the heat shut-out gate valve 31. The wafer 2 is placed on the holding portion 5 in the treatment chamber 1. At this point, the holding portion 5 is placed in a position lower than the wafer 2 that is supported at the arm portion 42 of the conveying arm 28 through the bumps 45. When the arm portion 42 is positioned on the holding portion 5, the holding portion 5 upwardly moves through the blank-out portion 46 of the arm portion 42 and receives the wafer 2 from the arm portion 42. When the holding portion 5 holds the wafer 2, the conveying arm 28 retreats to the input chamber 29. The wafer 2 is heat-treated in the treatment chamber 1.

The planar heating members 6, 6 disposed on the upper and lower surfaces of the treatment chamber 1 are controlled by the controller 9 so that the inside of the treatment chamber 1 are preheated at a predetermined temperature (for example, 1000° C.). Since the process gas flows between the first process gas supply portion 15 and the exhaust portion 16 or between the second gas supply portion 18 and the exhaust portion 19, the wafer 2 is immediately heat-treated with the process gas. In particular, according to the heat treatment apparatus, the wafer 2, which is horizontally held in the treatment chamber 1, is heated through the heat equalizing members 7 by the planar heating members 6, which are disposed on the upper and lower surfaces of the treatment chamber 1 and controlled at the predetermined temperatures. Thus, the wafer 2 can be quickly heated with equal temperature distribution on the entire surface and high repeatability regardless of the diameter thereof. Until the temperature of the wafer 2 is raised to 1000° C., the temperature difference on the entire surface of the wafer 2 is within ±3° C. After the temperature of the wafer 2 is raised to 1000° C., the temperature difference on the entire surface of the wafer 2 is within ±0.3° C. Thus, even if the size of the wafer is large (for example, 12 inches), the entire surface of the wafer 2 can be heated with equal temperature distribution.

In this case, the peripheral portion 6b of the planar heating member 6 is more closer to the wafer 2 than the center portion 6a thereof. In addition, the temperatures of the center portion 6a and the peripheral portion 6b are independently controlled. Thus, since the temperature difference between the center portion of the wafer 2 and the peripheral portion thereof is prevented from taking place, the temperature distribution on the entire surface of the wafer 2 can be easily equalized. Moreover, when the wafer 2 is heat-treated, if it is rotated by the motor 22, the heat treatment could be more equally performed.

Figure 5:
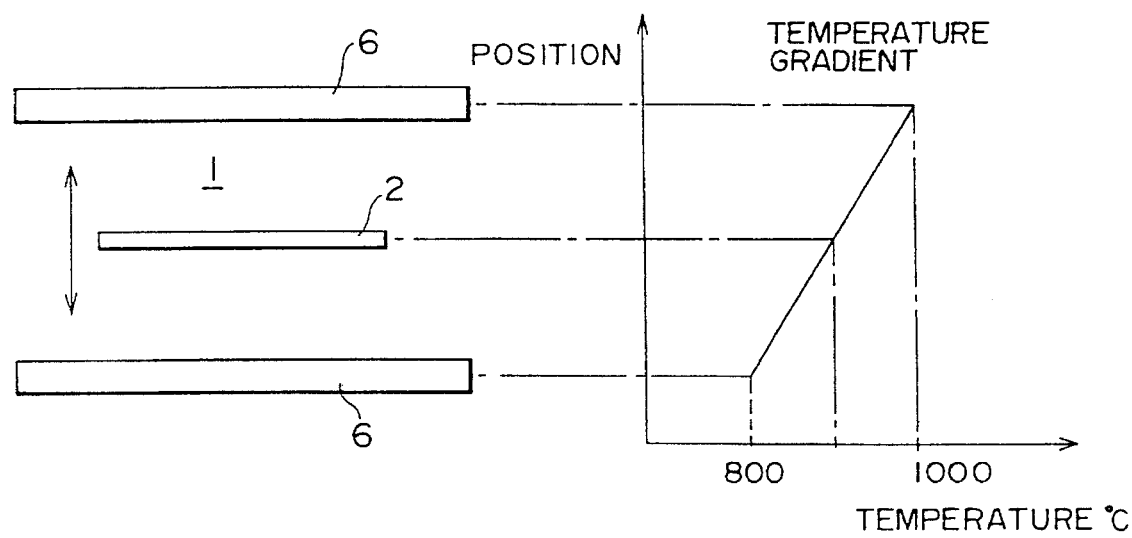
FIG. 5 is a schematic diagram for explaining an operation for heating a wafer to a desired temperature with a temperature slope in the treatment chamber.

According to the heat treatment apparatus, since heat treatment can be performed at high speed, excellent effects can be obtained in various heat treatment processes such as depositions of gate oxide films with thickness of 50 to 100 Å, very thin films such as capacitor insulation films, diffusion of impurities in thin regions of 0.1 µm or less. In addition, as shown in FIG. 5, the temperatures of the upper planar heating member 6 and the lower planar heating member 6 can be set to 1000° C. and 800° C., respectively. In other words, a temperature difference is formed between the upper and lower planar heating members 6 so as to form a temperature slope in vertical direction of the treatment chamber 1. The position of the wafer 2 is vertically adjusted by the holding portion 5. Thus, the wafer 2 can be heat-treated at a desired temperature in the range of 1000° C. to 800° C. In addition, according to the heat treatment apparatus, the heat shut-out gate valves 31 and the gas shut-out gate valves 32 are disposed at the opening portions 3 and 4 in the treatment chamber 1. Thus, these valves can securely shut out heat and process gas from the opening portions 3 and 4. Consequently, the wafer 2 that is placed in the input chamber 29 and has not been heat-treated or that is placed in the output chamber 30 and has been heat-treated is not affected thermally and chemically.

After the heat treatment for the wafer 2 has been completed, the conveying arm 28 in the output chamber 30 moves to the inside of the treatment chamber 1 through the gas shut-out gate valve 31 and the heat shut-out gate valve 31, receives the wafer 2 from the holding portion 5, and retreats to the output chamber 30. In the output chamber 30, the wafer 2 is cooled to for example ambient temperature with a cooling inert gas or the like. However, in this case, since the blank-out portion 46 of the lower plate portion 42b of the arm portion 42, which supports the wafer 2, fits to the lid portion 49, the condition of the upper portion of the wafer 2 is the same as the condition of the lower portion thereof. Thus, the wafer 2 can be equally cooled.

After the wafer 2 has been cooled, the wafer 2 is transferred to the outside of the heat treatment apparatus through the load lock chamber 53. Since the wafer 2 has been cooled, an oxide film is not formed on the wafer 2 by ambient air. According to the heat treatment apparatus, the input chamber 29 and the output chamber 30 are disposed on the upstream side and downstream side of the treatment chamber 1, respectively. Thus, while the heat treatment is being preformed in the treatment chamber 1, the next wafer 2 can be prepared in the input chamber 29 and a wafer 2 that has been heat-treated can be cooled in the output chamber 30. Consequently, the efficiency of the heat treatment process can be improved.

It should be appreciated that the present invention is not limited to the above-described first embodiment. In other words, the first embodiment may be varied in various manners without departing from the spirit and scope of the present invention. For example, in the first embodiment, the peripheral portions of the planar heating members 6 are close to the wafer 2. However, when the temperatures of the peripheral portions 6b are independently controlled, the planar heating members 6 may be formed without need to have the peripheral portions 6b. The center portion and the peripheral portion of each of the heat equalizing members 7 may be made of silicon carbide. The joint portion between the center portion and the peripheral portion may be made of alumina. In this case, heat can be shut out between the center portion and the peripheral portion.

In the first embodiment, the opening portions 3 and 4 are disposed on the upstream side and downstream side of the treatment chamber 1 so as to connect the input chamber 29 and the output chamber 30 to the treatment chamber 1, respectively. However, a common opening portion may be disposed on one side of the treatment chamber 1 so as to connect a common input/output chamber to the treatment chamber 1. In the first embodiment, the lid portion 49 that fits to the blank-out portion 46 on the lower plate portion 42b of the arm portion 42 is disposed in the output chamber 30. However, a lid means for opening and closing the blank-out portion 46 may be directly provided on the arm portion 43. As a means for equally cooling the entire surface of the wafer 2 that has been heat-treated, with the arm portion 42, which has the upper plate portion 42a and the lower plate portion 42b covering the upper surface and the lower surface of the wafer 2, the lid portion 49 or the lid means, which fits to the blank-out portion 46 of the arm plate 42, the arm portion 42 and the lid portion 49 or the lid means may be directly cooled by a wafer cooling pipe or the like.

The workpiece heat-treated by the heat treatment apparatus according to the present invention should be at least a planar workpiece that may be for example LCD as well as a semiconductor wafer. The heat treatment according to the present invention may be oxidizing treatment, diffusing treatment, or annealing treatment as well as CVD treatment.

According to the first embodiment, the following excellent effects can be obtained.

The workpiece, which is horizontally held in the treatment chamber, is heated by the planar heat generating members disposed on the upper and lower surfaces of the treatment chamber and controlled to predetermined temperatures through respective heat equalizing members. Thus, the workpiece can be quickly heated with an equal temperature distribution and high repeatability on the entire surface regardless of the diameter thereof.

In addition, with a temperature difference between the upper and lower planar heating members, a temperature slope is formed in the vertical direction of the treatment chamber. Moreover, the position of the workpiece against the planar heating members can be adjusted by the holding portion. Thus, the heat treatment can be performed at a proper temperature corresponding to the treatment.

Next, with reference to FIGS. 6 to 9, a heat treatment apparatus according to a second embodiment of the present invention will be described.

Figure 6:
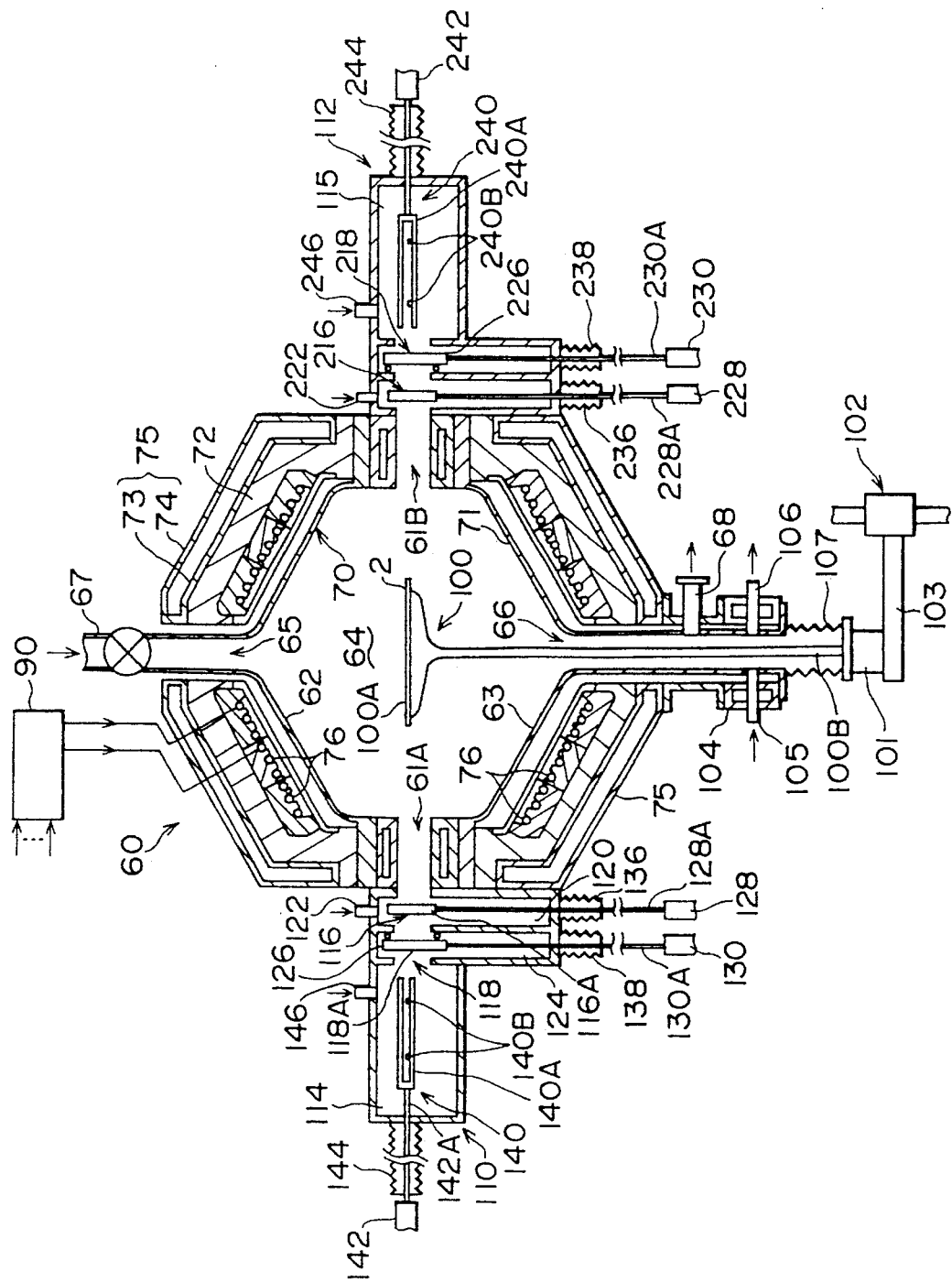
FIG. 6 is a schematic diagram showing a construction of principal portions of a heat treatment apparatus according to a second embodiment of the present invention.

In FIG. 6, reference numeral 60 is a heat treatment apparatus 60. The heat treatment apparatus 60 has a treatment chamber 64. The treatment chamber 64 has an upper wall portion 62 and a lower wall portion 63 that are separated with openings 61A and 61B. A workpiece 2 is horizontally input and output from and to the openings 61A and 61B, respectively.

The upper wall portion 62 and the lower wall portion 63 are made of highly purified clear quartz. A process gas inlet portion 65 and a process gas outlet portion 66 are formed at the center portions of the upper wall portion 62 and the lower wall portion 63, respectively. A gas supply pipe 67 is connected to the process gas inlet portion 65. The gas supply pipe 67 is a gas supply means for supplying a process gas from the outside to the heat treatment apparatus. An exhaust pipe 68 is connected to the process gas outlet portion 66. Also, the process gas is constituted to be flowed from the upper portion to the lower portion, but the process gas may be flowed from the lower portion to the upper portion. Further, the process gas may be flowed in a horizontal direction. The process gas supplying means may be constituted in such a manner that the process gas is supplied from the ring-shaped pipe 14, as shown in FIG. 1, is supplied from a nozzle, and is supplied from a shower-head. A workpiece holding portion that horizontally holds a workpiece 2 (that will be described later) and vertically moves is inserted into the process gas outlet portion 66. In addition to the vertical movement, the holding portion can rotate the workpiece 2 while holding it.

Shoulder portions 70 and 71 are formed of curved surfaces or slant surfaces that extend from the process gas inlet portion 65 and the process gas outlet portion 66 to side walls. Thus, the other and portions of the process gas inlet portion 65 and the process gas outlet portion 66 are formed in funnel shapes. Consequently, the occurrences of the eddy current and turbulence of the process gas relate to critical Reynolds number R=Ud/υ (where U is the flow velocity, d is the diameter of the flow path, and υ is the coefficient of kinematic viscosity), so that the flow path of the process gas does not abruptly widen.

Figure 7:
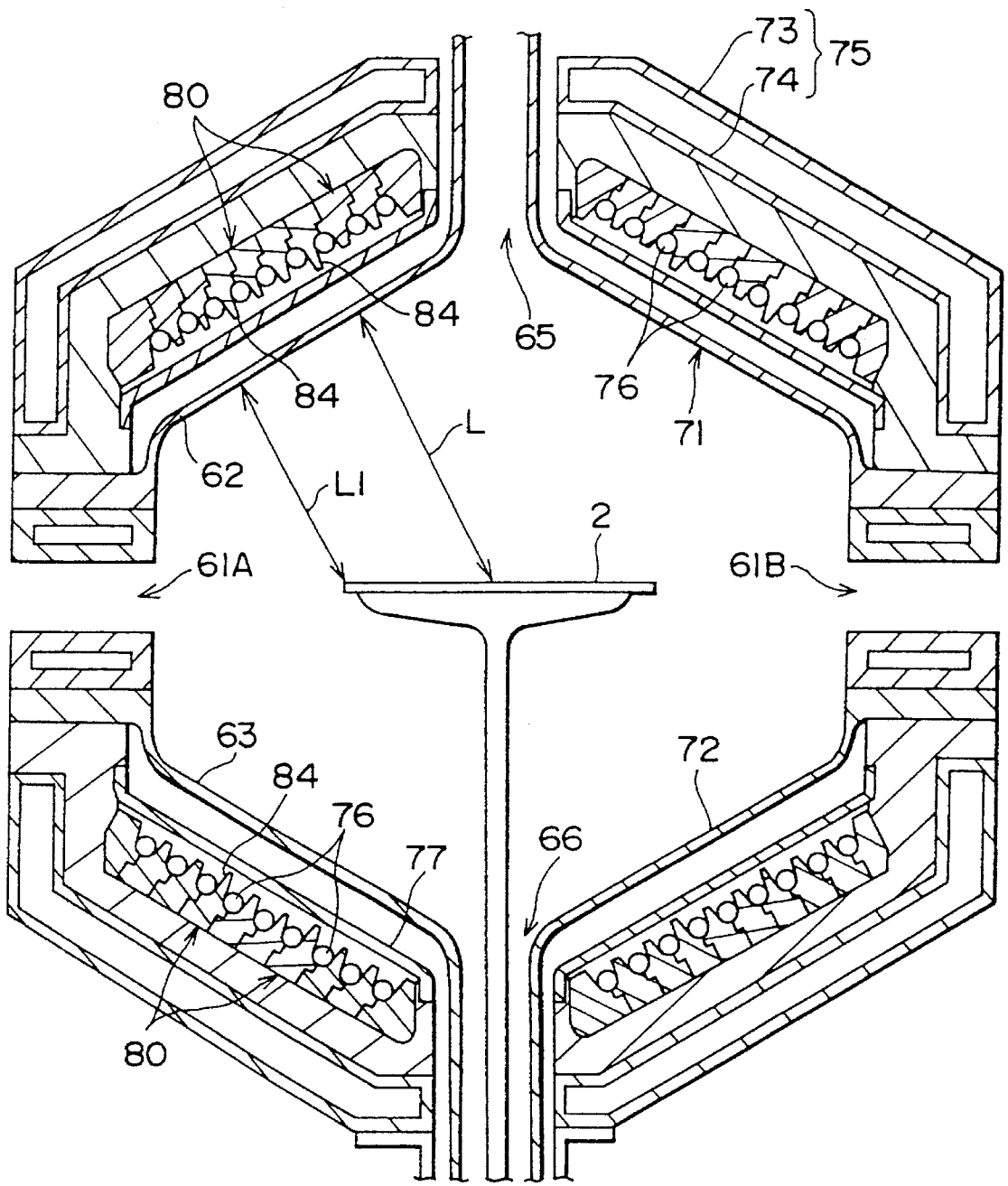
FIG. 7 is an enlarged view showing the principal portions of FIG. 6.

As shown in FIG. 7, the shoulder portions 70 and 71 are formed in such a manner that the length (L) between the center of the workpiece 2 and the inner wall of each of the shoulder portions 70 and 71 is longer than the length between the peripheral portion of the workpiece and the inner wall of each of the shoulder portions.

Heat insulating members 72 are disposed on the outer periphery of the treatment chamber 64. Each of the heat insulating members 72 are made of for example a mold of ceramic wool. A water cooling jacket 75 is disposed on the outer periphery of each of the heat insulating members 72. The water cooling jacket 75 is formed of an inner shell 73 and an outer shell 74. The water cooling jacket 75 insulates heat between the heat treatment apparatus 60 and the outside thereof.

A planar heat generating source 76 is disposed on the inner surface of the heat insulating member 72. The planar heat generating source 76 is formed of a ring-shaped or spiral resistance heat generating member made of for example molybdenum dicilicide or KANTHAL (trade name). An heat equalizing member 77 is disposed on the inner surface of the planar heat generating source 76. The heat equalizing member 77 is made of for example SiC, which has heavy metal contaminating resistance.

Thus, the planar heat generating sources 76 are disposed corresponding to the shapes of the shoulder portions 70 and 71 in such a manner that the length between the planar heat generating sources 76 and the center portion of the workpiece 2 is larger than the length between the planar heat generating sources 76 and the center peripheral portion of the workpiece 2. Thus, the peripheral portion of the workpiece 2 is closer to the heat sources than the center portion of the workpiece 2. Consequently, the temperature at the peripheral portion of the workpiece 2 is higher than the temperature at the center portion thereof.

Figure 8:
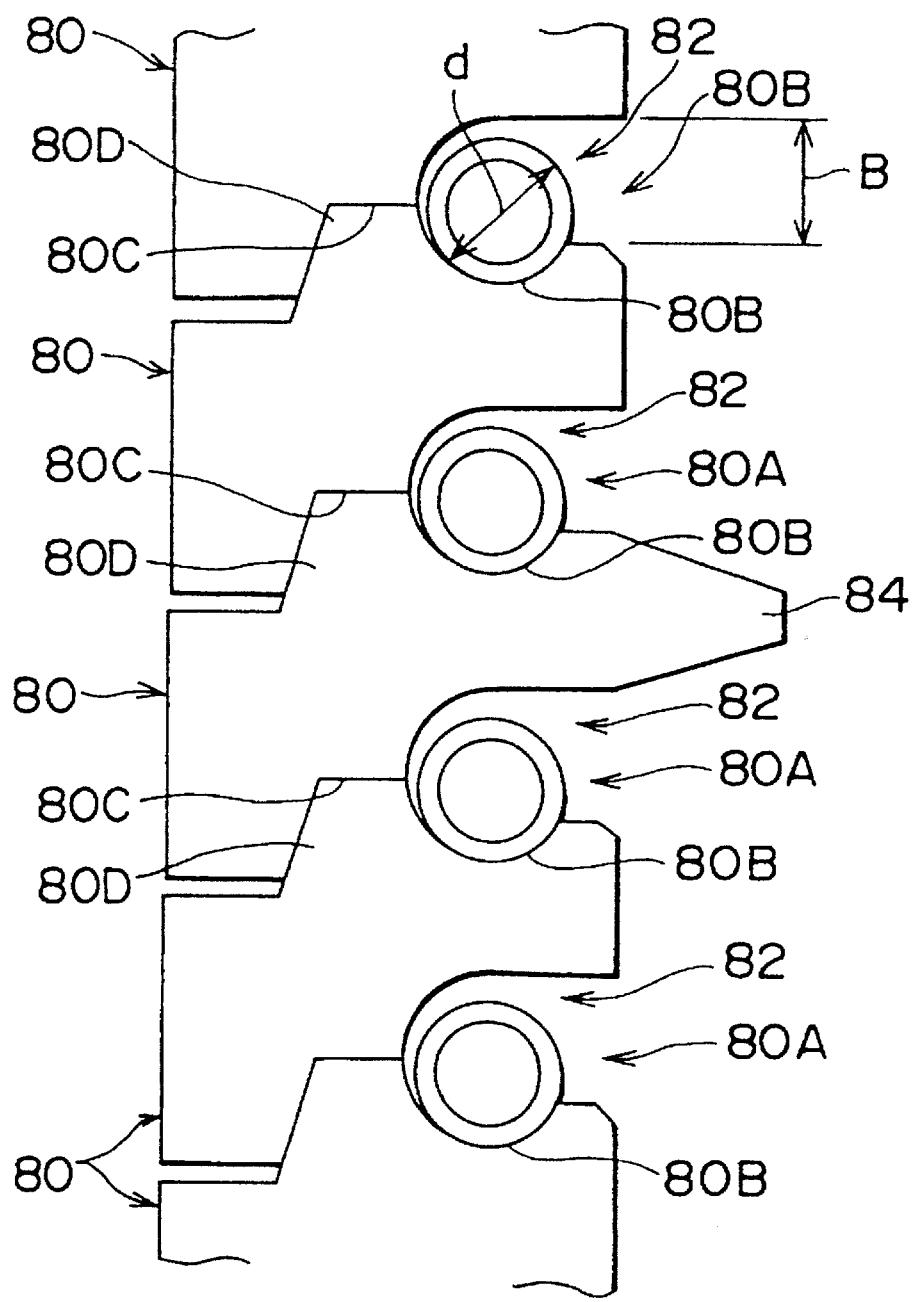
FIG. 8 is a partial sectional view showing a construction of heat insulating piece members of FIG. 6.

As shown in FIGS. 7 and 8, the planar heat generating sources 76 are supported by heat insulating piece members 80 that are divided into a plurality of zones corresponding to the shapes of the shoulder portions 70 and 71 of the upper wall portion 62 and the lower wall portion 63. The heat insulating piece members 80 form a plurality of heating zones corresponding to the shapes of the shoulder portions 70 and 71.

In other words, as shown in FIG. 8, the heat insulating piece members 80 are formed by solidifying a sintered material or a fiber material of for example mullite or corundum alumina. The heat insulating piece members 80 are formed of end piece members and intermediate piece members. The end piece members are disposed at both ends in the alignment direction of the heat insulating piece members, whereas the intermediate piece members are disposed between the end piece members. Each of the heat insulating piece members 80 has an opening 80A that is opposed to the treatment chamber 64. Each of the heat insulating piece member 80 has a holding portion 80B and an accommodating space 82 on the upper and lower surface thereof, respectively. The accommodating space 82 is opposed to the holding portion 80B. The holding portion 80B is formed of a cavity portion disposed on a peripheral portion of the heat insulating piece member 80. A resistance heat generating source may be disposed in the holding portion 80B. The accommodating space 80 is formed on a peripheral portion of the heat insulating piece member 80 so as to form a space opposed to the holding portion 80B on the upper surface of the heat insulating piece member 80.

The holding portion 80B and the accommodating space 82 form a continuous surface. A resistance heat generating member is disposed in the holding portion 80B. Thus, when the width (B) of the accommodating space 82 is smaller than the outer diameter (d) of the resistance heat generating member, it can be prevented from dropping and the heat expansion thereof can be absorbed. It should be noted that the resistance heat generating member can be prevented from dropping with the shape of the holding portion 80B.

A shoulder portion 80C is formed on the upper surface of the intermediate piece member. A protrusion 80D that fits to the shoulder portion 80C is formed on the lower surface of the upper piece member. The shoulder portion 80C and the protrusion 80D form a relative slant surface.

Thus, when both the shoulder portion 80C of one heat insulating piece member 80 and the protrusion 80D of another heat insulating piece member 80 are fitted, they can be stacked up without a deviation in the alignment direction. The slant surface of the stacked heat insulating piece members 80 shut out heat from the treatment chamber 64. Since the stacked heat insulating piece members 80 fit to an accommodating cavity portion of the corresponding heat insulating member 72, they are prevented from displacing in the alignment direction.

The heat insulating piece members 80 are divided into a plurality of heating zones corresponding to the shapes of the shoulder portions 70 and 71 of the upper wall portion 62 and the lower wall portion 63. A heat insulating piece member 80 at the boundary of each heating zone has a protrusion 84 opposed to the treatment chamber 64. The protrusion 84 prevents air from flowing to an adjacent zone. Thus, the temperature can be adjusted, zone by zone.

Each zone of the resistance heat generating members, which construct the planar heating sources formed of the heat insulating piece members 80 disposed zone by zone, is connected to a power supply portion. The temperatures of the resistance heat generating members are controlled by a control portion 90 (see FIG. 6) through temperature detecting sensors (not shown) disposed, zone by zone.

The workpiece 2 is horizontally held by a workpiece holding member 100.

The workpiece holding member 100 vertically moves and rotates while holding the workpiece 2 at a treatment position in the treatment chamber 64. The holding member 100 has a holding surface 100A and a vertical shaft 100B. The holding surface 100A is disposed at the upper end of the holding member 100. The vertical shaft 100B is made of quartz and integrally formed into the holding surface 100A. The lower end of the vertical shaft 100B is inserted into a process gas exhaust portion that is a cylinder portion of the lower wall portion 63 of the treatment chamber 64. The lower end of the vertical shaft 100B is connected to a rotation driving motor 101. After the workpiece holding member 100 holds the workpiece 2, the holding member 100 vertically moves to adjust the position of the workpiece. Therefore, under the heat treatment, the workpiece 2 is disposed at a position of the optimum temperature and a position of the optimum gas distribution.

The rotation driving motor 101 is integrally formed into a lifting arm 103 of a lifting device 102. The lifting device 102 vertically moves the workpiece 2.

A cooling pipe 104 is disposed on the outer periphery at a lower position of the lower wall portion 63. A purge gas supply pipe 105 and a purge gas exhaust pipe 106 are disposed below the exhaust pipe 68. A purge gas for shutting out the process gas is supplied to the cylindrical portion through the purge gas supply pipe 105. An example of the purge gas is an inert gas such as $N_2$ gas.

To prevent the purge gas from leaking out, a bellows portion 107 is disposed between the lower end of the lower wall portion 63 and the rotation driving motor 101 so as to seal the portion therebetween and allow the vertical shaft to vertically move.

An input device 110 and an output device 112 are disposed at the openings 61A and 61B of the treatment chamber 64, respectively. The input device 110 horizontally inputs the workpiece 2 to the treatment chamber 64, whereas the output device 112 horizontally outputs the workpiece 2 from the treatment chamber 64.

The input device 110 and the output device 112 are disposed in an input chamber 114 and an output chamber 115, respectively. The input chamber 114 and the output chamber 115 are opposed with the treatment chamber 64 therebetween. Since the construction of the input device 110 in the input chamber 114 is the same as the construction of the output device 112 in the output chamber 115, only constructional parts of the input device 110 will be described. In FIG. 6, the construction parts of the output device 112 are denoted by adding 100 to reference numerals of the constructional parts of the input device 110.

Before describing the input device 110 and the output device 112, a mechanism for preventing heat and process gas from entering the input chamber 114 and the output chamber 115 will be described.

A heat shut-out gate valve 116 and a gas shut-out gate valve 118 are disposed between the input chamber 114 and the opening 61A. The heat shut-out gate valve 116 shuts out heat from the opening portion 61A. The gas shut-out gate valve 118 shuts out the process gas from the opening portion 61A. The heat shut-out gate valve 116 has a valve portion 116A and a valve chamber 120. The valve portion 116A is made of for example alumina or quartz, which has heat resistance. The valve chamber 120 accommodates the valve portion 116A so as to open and close the heat shut-out gate valve 116. A gas supply opening 122 and a gas exhaust opening (not shown) are connected to the valve chamber 120. Thus, the inert gas that shuts out the process gas is directed to the valve chamber 120 so as to form a gas curtain.

The gas shut-out gate valve 118 has a valve portion 118A and a valve chamber 124. The valve portion 118A is made of anti-corrosively treated aluminum or stainless steel. The valve chamber 124 accommodates the valve portion 118A so as to open and close the gas shut-out gate valve 118. A seal member 126 is disposed between the front surface of the valve portion 118A and the wall surface of the valve chamber 124 so as to seal the portion therebetween.

Pistons 128A and 130A of hydraulic cylinders 128 and 130 are connected to the valve portions 116A and 118A, respectively. The hydraulic cylinders 128 and 130 are disposed outside the valve chambers 120 and 124, respectively. The pistons 128A and 130A pierce wall portions of the valve chambers 120 and 124, respectively. Bellows portion 136 and 138 are disposed between outer walls of the valve chambers 120 and 124 and the pistons 128A and 130A, respectively. The bellows portion 136 and 138 seal the portions that the pistons 120A and 130A pierce.

It should be noted that a cooling portion may be disposed between the opening portions 61A and 61B and the valve chambers 120 and 124, respectively, so as to shut out heat from the treatment chamber 64 to the valve chambers.

The input device 110 is disposed in the input chamber 114 where the valve chambers 120 and 124 are disposed. The input device 110 has a conveying arm 140 and a hydraulic cylinder 142 that forwardly moves the conveying arm 140.

The conveying arm 140 has an arm body 140A with two prongs. The lower prong has a blank-out portion (not shown) for preventing the arm body 140 from interfering with the workpiece holding portion 100. The lower prong has a plurality of bumps 140 for holding the workpiece 2.

The arm body 140A is integrally formed into the piston 142A of the hydraulic cylinder 142. Thus, the arm body 140A can be placed at a forward position and a backward position. At the forward position, the arm body 140A is placed below the workpiece holding portion 100. At the backward position, the arm body 140A is placed in the input chamber 114. When the arm body 140A is placed below the workpiece holding portion 100, the workpiece 2 is transferred from the arm body 140A to the workpiece holding portion 100. Since the piston 142 pierces the wall portion of the input chamber 114, to seal the pierced portion, a bellows portion 144 is disposed between the wall portion and the piston 142.

The input chamber 114 is connected to a purge gas supply opening 146 and a purge gas exhaust opening (not shown)

so as to keep the inside of the input chamber in an inert gas atmosphere. A mechanism for pre-heating the purge gas supplied to the input chamber 114 may be provided so as to raise the temperature of the surface of the workpiece 2 being input and shorten the temperature rise time for the treatment.

Next, the operation of the heat treatment apparatus will be described.

In the treatment chamber 64, the upper wall portion 62 and the lower wall portion 63 are formed in funnel shapes, thereby creating a laminar flow of the process gas supplied from the process gas inlet portion 65. In this embodiment, the flow rate of the process gas is at 10 m/min or higher. Thus, the process gas supplied from the inlet portion 65 becomes a stream that is vertically symmetrical. As a result, an eddy current and a turbulence that tend to occur at the center portion of the workpiece 2 can be effectively offset. Consequently, the concentration of the process gas that contacts the center portion of the workpiece 2 is kept in a proper level.

The process gas that contacted the workpiece 2 is directed to the outside of the heat treatment apparatus through the peripheral portion of the workpiece 2, the outlet portion 66, and the exhaust pipe 68.

The process gas that flows to the outlet portion 66 is prohibited from flowing into the rotation driving motor 101 by the purge gas supplied from the gas supply opening 105. Thus, the process gas does not leak out from the connecting portion of the bellows portion 107.

The workpiece 2 is heated by the planar heat generating sources 76 through the heat equalizing members 77 so that the peripheral portion of the workpiece 2 is more easily heated than the center portion thereof.

Figure 9:
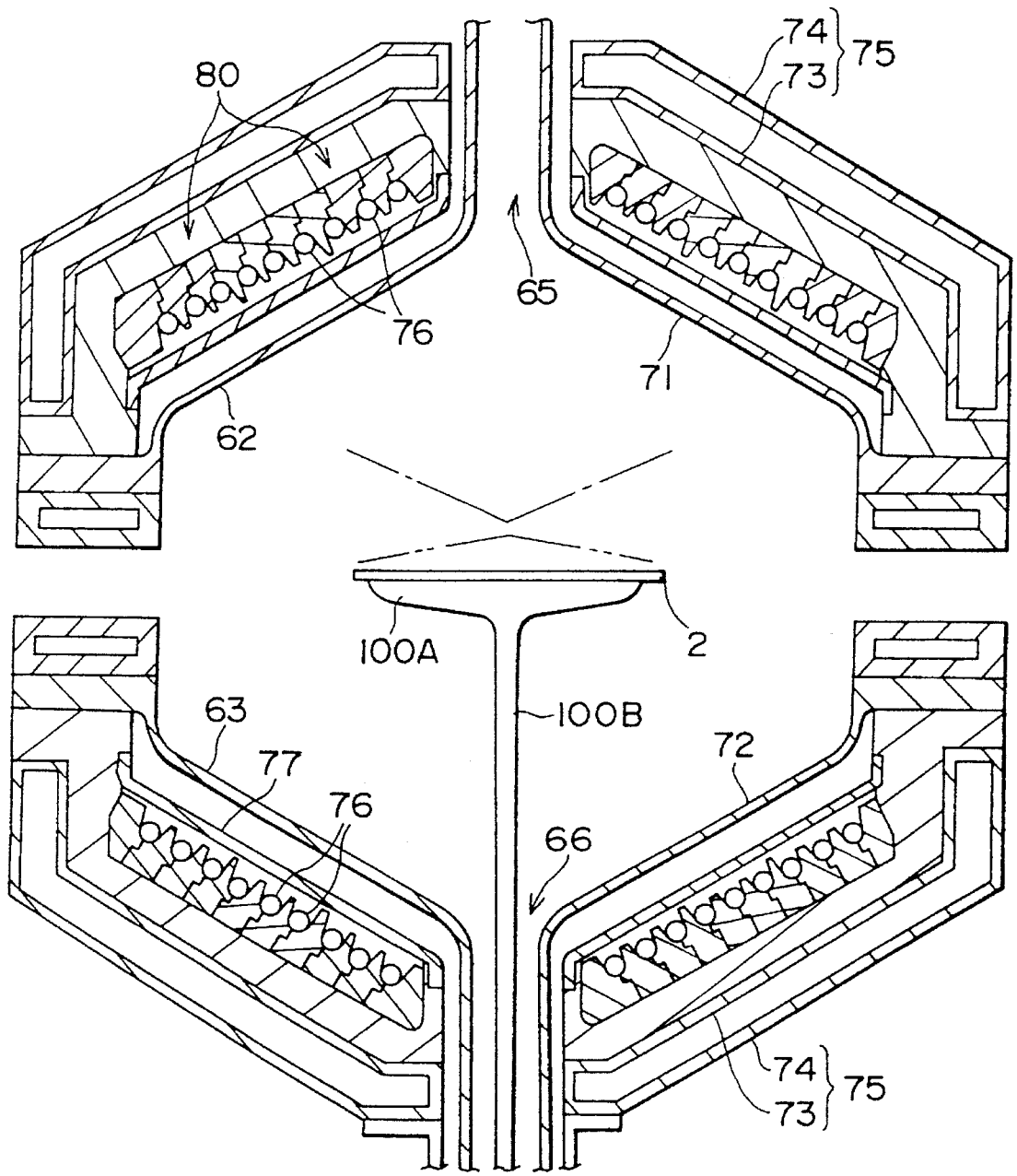
FIG. 9 is a schematic diagram for explaining surface characteristics of a workpiece treated by the principal portions of FIG. 6.

As denoted by a one-dash line of FIG. 9, the temperature at the peripheral portion is higher than the temperature at the center portion.

Thus, since the temperature rise at the peripheral portion of the workpiece 2 placed in the treatment position is higher than the temperature rise at the center portion thereof, heat radiation loss is compensated and thereby the temperature distribution on the entire surface of the workpiece 2 becomes equal. Consequently, in comparison with the conventional surface characteristics denoted by a two-dash line of FIG. 9, the amount of film formed at the peripheral portion increases. As a result, the deviation of the amount of film formed on the surface of the workpiece 2 becomes small. Thus, the thickness of film formed on the surface becomes equal.

In particular, since the amount of heat radiation at the center portion is smaller than that at the peripheral portion, when the concentration of the process gas is proper, a relatively thick film is formed. However, when a temperature for which the amount of film formed at the center portion is obtained is set for the peripheral portion, the thickness of film on the entire surface of the workpiece 2 becomes equal. In addition, since the planar heat generating sources are disposed on the lower wall portion 63, the rear surface of the workpiece 2 is kept warm. Thus, the temperature distribution on the entire surface of the workpiece 2 is kept equal.

In addition, a desired temperature distribution can be obtained on the surface of the workpiece 2 by controlling the temperatures of the zones of the planar heat generating sources 76 corresponding to the shapes of the shoulder portions 70 and 71 of the upper wall portion 62 and the lower wall portion 64.

The workpiece 2 is input and output to and from the treatment chamber 64 in the following manner.

The workpiece 2 is conveyed from a load lock chamber (not shown) to the input chamber 114 by the conveying arm 140. At this point, the valve portions 116 and 118 in the valve chambers 120 and 124 connected to the openings 61A are opened. Thus, the workpiece 2 is conveyed into the treatment chamber 64. The workpiece 2 is transferred from the arm body 140A to the workpiece holding portion 100.

After the workpiece is transferred to the workpiece holding portion 100, the conveying arm 140 retreats to the input chamber 114 and the valve portions 116 and 118 in the valve chambers 120 and 124 are closed.

Since an eddy current and a turbulence at the center portion of the workpiece 2 are offset with a laminar flow of the process gas, a film is formed on the treatment chamber 64 with a proper concentration of the process gas. In addition, due to the difference of heating conditions between the center portion and peripheral portion, the amount of film formed at the peripheral portion is increased more than that of the related art reference.

After the treatment has been completed, the workpiece 2 is conveyed from the treatment chamber 64 to the output chamber 112 by the conveying arm 240.

Since the planar heat generating sources 76 are disposed above and below the workpiece 2, when different temperatures are set for the upper and lower planar heat generating sources 76, a vertical temperature slope can be set in the treatment chamber 64. Thus, temperature conditions for forming a film can be selected.

Since the heat insulating piece members 130 are divided into zones corresponding to the shapes of the upper and lower wall portions, the temperature conditions for these zones can be varied. Thus, the temperature conditions on the surface of the workpiece 2 can be precisely controlled.

The present invention is not limited to the above-described embodiments. Instead, the embodiments may be modified in various manners without departing from the spirit and scope of the present invention. For example, instead of the planar heat generating sources 76, the heat equalizing members may be divided into zones. In this case, the heat capacity for each heat equalizing member should be varied, zone by zone.

The workpiece according to the present invention may be a planar workpiece. Besides a semiconductor wafer, the workpiece may be an LCD substrate. The heat treatment apparatus according to the present invention is not limited to the CVD treatment apparatus. Instead, the present invention may be applied to an aparatus for an oxidizing treatment, a diffusing treatment, an annealing treatment, or the like.

As described above, according to the second embodiment, a stream that is vertically symmetrical is obtained due to the shapes of the shoulder portions. Thus, since an eddy current and a turbulence that tend to take place upon supply of a process gas is prevented, the process gas can be equally contacted to the entire surface of the workpiece.

In addition, according to the second embodiment, since the planar heat generating sources are disposed along the shapes of the shoulder portions, the amount of heat radiated to the peripheral portion of the workpiece is larger than the amount of heat radiated to the center portion of the workpiece. Thus, the temperature distribution of the workpiece becomes equal, thereby improving the surface equality of the workpiece.

Moreover, according to the second embodiment, the planar heat generating members are supported by the heat insulating piece members disposed corresponding to the shapes of the shoulder portions of the treatment chamber. In addition, since the heat insulating piece members are divided into a plurality of zones corresponding to the shoulder portions, the amount of heat radiated to the workpiece can be varied corresponding to the shapes of the shoulder portions. Thus, the temperature distribution on the surface of the workpiece becomes equal.

Although the present invention has been shown and described with respect to the best mode embodiments thereof, it should be understood by those skilled in the art that the foregoing and various other changes, omissions, and additions in the form and detail thereof may be made therein without departing from the spirit and scope of the present invention.

What is claimed is:

1. A heat treatment apparatus comprising:
   a treatment chamber for heat-treating a workpiece arranged therein;
   means for transferring the workpiece into said treatment chamber, and transferring the heat-treated workpiece from said treatment chamber to the outside thereof;
   means for holding the workpiece transferred into said chamber;
   a first heat generating source arranged above the workpiece and said heat treatment apparatus having a heat equalizing member provided between the workpiece and the first heat generating source, so as to heat the workpiece held in said chamber to the predetermined temperature, said first heat generating source including a planar center portion arranged above the workpiece, a planar peripheral portion arranged radially externally and above the workpiece, and a step portion formed between the center and peripheral portions, and said peripheral portion is arranged in parallel with the center portion; and
   means for controlling the temperature of said first heat generating source so that the center and peripheral portions are independently controlled to respective predetermined temperatures by said controlling means.

2. The apparatus according to claim 1, wherein said transferring means makes the workpiece transfer from horizontal direction into said chamber, and makes the workpiece transfer from said chamber to the horizontal direction.

3. The apparatus according to claim 2, wherein said transferring means includes a heat shut-out gate valve and a gas shut-out gate valve, respectively, arranged on openings of said chamber.

4. The apparatus according to claim 1, wherein said transferring means includes a cover member for surrounding the workpiece and transferring the workpiece to said holding means.

5. The apparatus according to claim 1, further comprising means for cooling the workpiece which is heat-treated and is transferred from said chamber to a load-lock chamber.

6. The apparatus according to claim 1, further comprising: means for supplying process gas into said chamber; and means for exhausting process gas from said chamber.

7. The apparatus according to claim 6, wherein said gas supplying means supplies gas through a supply opening provided at one of an upper and lower portion of said chamber, and said gas exhausting means exhausts process gas through an exhaust opening provided at an opposite one of said lower and upper portions of said chamber.

8. The apparatus according to claim 6, wherein said gas supplying means supplies process gas from a side portion of said chamber, and said gas exhausting means exhausts process gas through an opposed-side portion of said chamber.

9. A heat treatment apparatus comprising:
   treatment chamber for heat-treating a workpiece arranged therein;
   means for transferring the workpiece into said treatment chamber, and transferring the heat-treated workpiece from said treatment chamber to the outside thereof;
   means for holding the workpiece transferred into said chamber;
   a first heat generating source arranged above the workpiece and a second heat generating source arranged below the workpiece and said heat treatment apparatus having a pair of heat equalizing members with a first provided between the workpiece and said first heat generating source and a second provided between the workpiece and the second heat generating source, so as to heat the workpiece held in said chamber to the predetermined temperature; and
   a wall structure having an upper wall portion, a side wall portion which includes an intermediate peripheral side edge portion, and a lower wall portion which portions cooperate to constitute said chamber, said side wall portion further including an upper shoulder portion which slopes outwardly from the upper wall portion to the intermediate peripheral side edge portion, and said side wall portion also including a lower shoulder portion which slopes inwardly from said intermediate side edge portion to said lower wall portion,
   wherein said heat generating sources are arranged outside respective ones of said shoulder sections and slope in common with the shoulder section positioned most adjacent thereto, and said apparatus further comprising heat insulating piece members which surround resistance heat generating members of said heat generating sources and are arranged so as to slope in common with the shoulder sections, and wherein the heat insulating piece members are divided into a plurality of zones, and said wall structure includes a heat insulating wall for preventing heat from transmitting from one zone to the other zone.

10. The apparatus according to claim 9, wherein the perpendicular distance from each of said shoulder sections to the center of the workpiece is longer than the perpendicular distance from each of said shoulder sections to the periphery of the workpiece.

11. The apparatus according to claim 9, wherein each heat equalizing member extends parallel with a corresponding one of said heat generating sources and most adjacent shoulder section.

12. The apparatus according to claim 9, further comprising: means for supplying process gas into said chamber; and means for exhausting process gas from said chamber.

13. The apparatus according to claim 12, wherein said gas supplying means supplies process gas through a supply opening provided at one of an upper and lower portion of said chamber, and said gas exhausting means exhausts process gas through an exhaust opening provided at an opposite one of said lower and upper portions of said chamber.

14. The apparatus according to claim 12, wherein said gas supplying means supplies process gas from a side portion of said chamber, and said gas exhausting means exhausts process gas through an opposed-side portion of said chamber.

15. The apparatus according to claim 9, wherein said holding means, after holding the workpiece, lifts the workpiece to adjust the position of the workpiece.

16. The apparatus according to claim 9, wherein said heat generating sources are comprised of ring-shaped or spiral-shaped resistance heat generating members.

17. A heat treatment apparatus as recited in claim 1 further comprising a second heat generating source arranged below the workpiece and said apparatus further comprising a second heat equalizing member provided between the workpiece and the second heat generating source so as to facilitate the heating of the workpiece held in said chamber to the predetermined temperature, and said second heat generating source also including a center portion arranged below the workpiece, a peripheral portion arranged radially externally and below the workpiece, and a step portion formed between the center and peripheral portions of said second heat generating source, and said peripheral portion of said second heat generating source being arranged parallel with the center portion of said second heat generating source, and said controlling means controlling the temperature of said second heat generating source so that the center and peripheral portions of said second heat generating source are independently controlled to respective predetermined temperatures by said controlling means.

18. A heat treatment apparatus as recited in claim 17 wherein said center portion of said first heat generating source is at a level further removed from the workpiece than a level of said peripheral portion of said first heat generating source, and said center portion of said second heat generating source is at a level further removed from the workpiece than a level of the peripheral portion of said second heat generating source.

19. A heat treatment apparatus comprising:

a treatment chamber which includes an interior heat treatment area for heating a workpiece to a treatment temperature and an inlet opening for receiving a workpiece to be treated;

a workpiece holder which supports a workpiece within the heat treatment area of the heat treatment apparatus;

a first heat generating source positioned between a first wall portion of said treatment chamber and a first surface of a workpiece supported on said workpiece holder, said first heat generating source including a planar center portion, a planar peripheral portion and a step portion formed between the center and peripheral portions, said peripheral portion being arranged parallel with the center portion, and said peripheral portion being dimensioned so as to have an internalmost edge which is positioned radially outward and above the workpiece when the workpiece is located on said holder;

means for controlling temperature of said first heat generating source so that the center and peripheral portions are independently controlled to temperatures which in combination are designed to achieve a uniform temperature distribution across the workpiece; and a first heat equalizing member positioned between the workpiece when positioned on the holder for treatment and said first heat generating source.

20. A heat treatment apparatus as recited in claim 19 further comprising a second heat generating source positioned between a second wall portion of said treatment chamber and a second surface of the workpiece when supported on said holder, which second surface is opposite to the first surface of the workpiece, said second heat generating source including a center portion and a peripheral portion which is both parallel and at a different level than said center portion, and said second heat generating source including a step portion which extends between said center and peripheral portions; and said apparatus further comprising means for controlling temperature of said second heat generating source so that the peripheral and center portions of said second heat generating source are independently controlled, and said peripheral and center portions of said first and second heat sources being horizontal and said stepped portions extending transverse to said horizontal center and peripheral portions.

21. A heat treatment apparatus as recited in claim 20 further comprising a second heat equalizing member positioned between the workpiece when positioned on the holder for treatment and said second heat generating source, and said first and second heat equalizing members also having a center portion, a peripheral portion and a stepped portion which extends between the peripheral and center portions of said heat equalizing members, and said first and second heat equalizing members having a center portion in a nested arrangement within a recess formed by the step portion of a corresponding one of said first and second heat generating sources.

22. A heat treatment apparatus as recited in claim 20 wherein said center portion of said first heat generating source is at a level which is further removed from the workpiece than a level assumed by said peripheral portion of said first heat generating source.

\* \* \* \* \*